(12) United States Patent
Ho et al.

(10) Patent No.: US 10,678,314 B2
(45) Date of Patent: Jun. 9, 2020

(54) DYNAMIC THERMAL MANAGEMENT FOR OPTIMAL BATTERY CHARGING

(71) Applicant: Microsoft Technology Licensing, LLC, Redmond, WA (US)

(72) Inventors: Chau Van Ho, Des Moines, WA (US); Lawrence David Azzano, Mercer Island, WA (US); David Otto Whitt, III, Sammamish, WA (US); Andrew Douglas Delano, Woodinville, WA (US); Lincoln Ghioni, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 39 days.

(21) Appl. No.: 15/979,264

(22) Filed: May 14, 2018

(65) Prior Publication Data

US 2019/0346895 A1    Nov. 14, 2019

(51) Int. Cl.
*H02J 7/04* (2006.01)
*H02J 7/16* (2006.01)
(Continued)

(52) U.S. Cl.
CPC ............ *G06F 1/206* (2013.01); *G06F 1/1635* (2013.01); *G06F 1/203* (2013.01); *H01M 10/443* (2013.01);
(Continued)

(58) Field of Classification Search
CPC ........ G06F 1/206; G06F 1/1635; G06F 1/203; H01M 10/617; H01M 10/623;
(Continued)

(56) References Cited

U.S. PATENT DOCUMENTS 3,935,028 A * 1/1976 Strasser .................. H01M 8/08
                                                                429/409
5,871,859 A    2/1999 Parise
(Continued)

FOREIGN PATENT DOCUMENTS

| CN | 106356584 A | 1/2017 |
| WO | 2014158481 A1 | 10/2014 |
| WO | 2017122690 A1 | 7/2017 |

OTHER PUBLICATIONS

"BU-410: Charging at High and Low Temperatures", Retrieved from: <<https://web.archive.org/web/20160622155022/http://batteryuniversity.com/learn/article/charging_at_high_and_low_temperatures>>, Jun. 22, 2016, 8 Pages.
(Continued)

*Primary Examiner* — Zixuan Zhou
(74) *Attorney, Agent, or Firm* — Ray Quinney & Nebeker P.C.; Paul N. Taylor

(57) ABSTRACT

Optimized charging of a battery of a computing device is provided. The computing device includes a dynamic phase change device. The dynamic phase change device includes a wick structure with a valve. The valve is operable to regulate a working fluid of the dynamic phase change device based on a position of the valve. The computing device also includes a battery physically connected to and in thermal communication with the dynamic phase change device, and a sensor operable to determine a temperature of the battery. The computing device includes a first heat generating component physically and thermally connected to the dynamic phase change device. The first heat generating component or a second heat generating component is configured to compare the determined temperature to a predetermined temperature and control the valve based on the comparison.

20 Claims, 7 Drawing Sheets

(51) Int. Cl.
  *G06F 1/20* (2006.01)
  *H01M 10/617* (2014.01)
  *H01M 10/623* (2014.01)
  *H01M 10/63* (2014.01)
  *H01M 10/659* (2014.01)
  *H01M 10/667* (2014.01)
  *G06F 1/16* (2006.01)
  *H01M 10/44* (2006.01)
  *H01M 10/48* (2006.01)
  *H02J 7/00* (2006.01)
  *H05K 7/20* (2006.01)

(52) U.S. Cl.
  CPC ....... *H01M 10/486* (2013.01); *H01M 10/617* (2015.04); *H01M 10/623* (2015.04); *H01M 10/63* (2015.04); *H01M 10/659* (2015.04); *H01M 10/667* (2015.04); *H02J 7/007* (2013.01); *H02J 7/0029* (2013.01); *H05K 7/20327* (2013.01); *H05K 7/20336* (2013.01); *H05K 7/20381* (2013.01); *G06F 2200/201* (2013.01); *H01M 2220/30* (2013.01)

(58) Field of Classification Search
  CPC .. H01M 10/63; H01M 10/659; H01M 10/667; H01M 10/443; H01M 10/486; H02J 7/0029; H02J 7/007; H05K 7/20327; H05K 7/20336; H05K 7/20381
  USPC .................................. 320/150; 429/62, 120
  See application file for complete search history.

(56) References Cited

U.S. PATENT DOCUMENTS

| | | |
|---|---|---|
| 6,167,955 B1 | 1/2001 | Van Brocklin et al. |
| 6,286,109 B1 | 9/2001 | Pirdy |
| 7,411,337 B2 | 8/2008 | Tadayon et al. |
| 8,244,296 B2 | 8/2012 | Dorsey et al. |
| 8,624,560 B2 | 1/2014 | Ungar et al. |
| 2001/0011884 A1* | 8/2001 | Sakakibara ........... H02J 7/0026 320/150 |
| 2009/0050292 A1 | 2/2009 | Yu et al. |
| 2011/0210703 A1 | 9/2011 | Souza et al. |
| 2012/0003515 A1* | 1/2012 | Eisenhour ........... H01M 10/625 429/62 |
| 2013/0078495 A1 | 3/2013 | Chiu |
| 2013/0241490 A1* | 9/2013 | Kim .................... H01M 10/443 320/112 |
| 2017/0125866 A1 | 5/2017 | Zhou et al. |
| 2017/0271887 A1 | 9/2017 | Heo |

OTHER PUBLICATIONS

"International Search Report and Written Opinion Issued in PCT Application No. PCT/US19/029550", dated Jul. 18, 2019, 10 pages.

* cited by examiner

DYNAMIC THERMAL MANAGEMENT FOR OPTIMAL BATTERY CHARGING

BRIEF DESCRIPTION OF THE DRAWINGS

For a more complete understanding of the disclosure, reference is made to the following detailed description and accompanying drawing figures, in which like reference numerals may be used to identify like elements in the figures.

Figure 1:
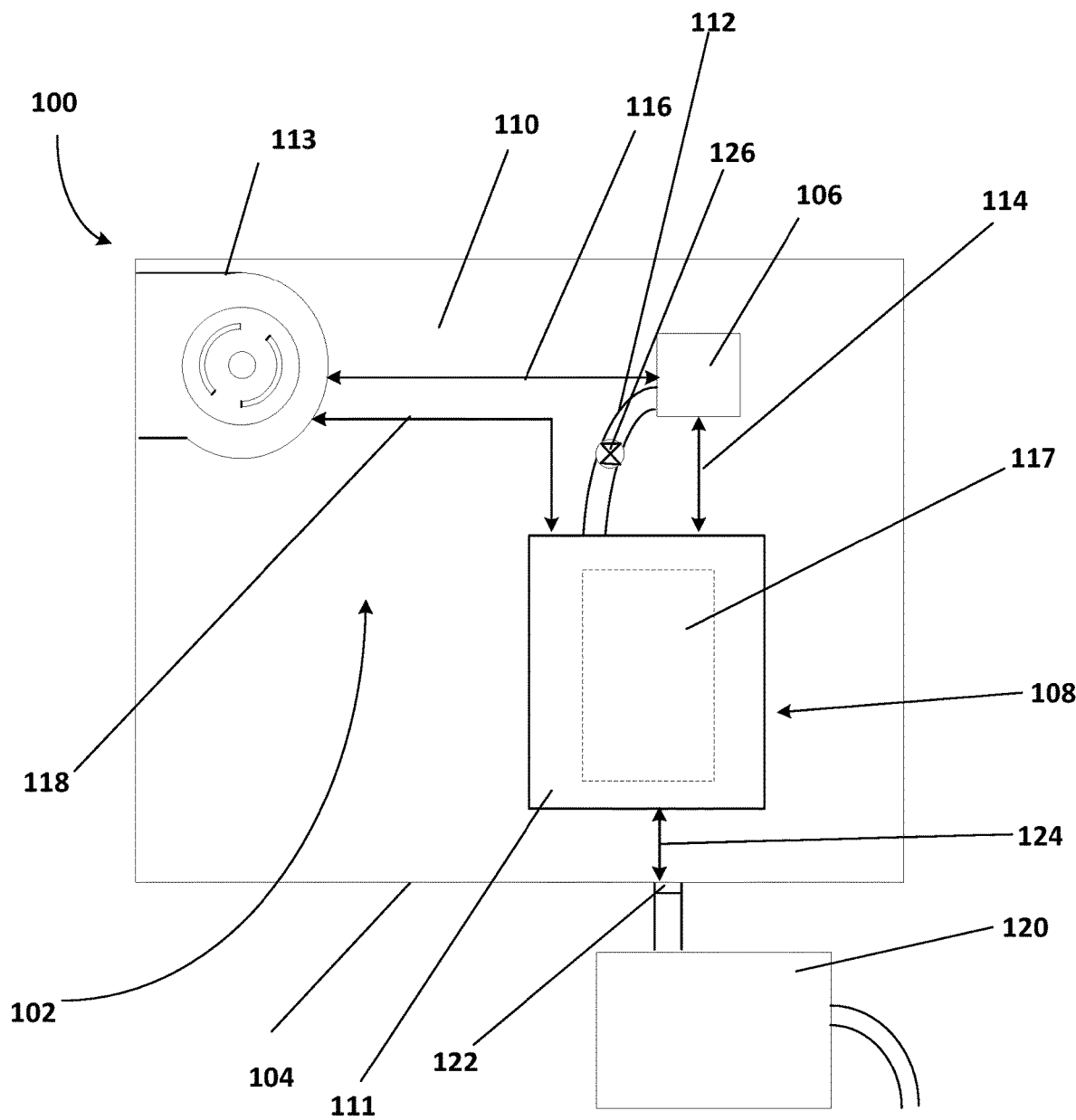
FIG. 1 depicts a top view of an example of a computing device with a top removed.

While the disclosed devices, systems, and methods are representative of embodiments in various forms, specific embodiments are illustrated in the drawings (and are hereafter described), with the understanding that the disclosure is intended to be illustrative, and is not intended to limit the claim scope to the specific embodiments described and illustrated herein.

DETAILED DESCRIPTION

Current microprocessor design trends include designs having an increase in power, a decrease in size, and an increase in speed. This results in higher power in a smaller, faster microprocessor. Another trend is towards lightweight and compact electronic devices. As microprocessors become lighter, smaller, and more powerful, the microprocessors also generate more heat in a smaller space, making thermal management a greater concern than before.

The purpose of thermal management is to maintain the temperature of a device within a moderate range. During operation, electronic devices dissipate power as heat that is to be removed from the device. Otherwise, the electronic device will get hotter and hotter until the electronic device is unable to perform efficiently. When overheating, electronic devices run slowly and dissipate power poorly. This can lead to eventual device failure and reduced service life.

As computing devices get smaller (e.g., thinner), thermal management becomes more of an issue, and less volume is available for thermal management. Heat may be dissipated from a computing device using forced and natural convection, conduction, and radiation as a way of cooling the computing device as a whole and a processor operating within the computing device.

Additionally, as computing devices get smaller (e.g., thinner), less volume is available for a power source (e.g., a battery), and battery life, for example, becomes more of an issue. Users of such computing devices expect access to the computing device with minimal down time due to battery capacity and associated charging times, and battery life.

When a battery (e.g., a lithium ion battery) is at a low temperature (e.g., below 25 degrees Celsius) during charging, lithium ions may each gain an electron and become metallic lithium. The metallic lithium may deposit on the anode of the battery because at the low temperature, transfer rate decreases and penetration of lithium ions into negative electrode carbon slows down. The metallic lithium may react with an electrolyte, causing permanent loss of the lithium ions. The chemical reaction between the metallic lithium and the electrolyte generates heat and may lead to thermal runaway. This degrades the battery faster and negatively affects the battery life. Accordingly, when the battery is at a low temperature, charge current and/or charge voltage is reduced to reduce the lithium ion loss and avoid thermal runaway. For example, when the battery is at a low temperature, the charge rate may be reduced to 0.2 C (e.g., with a charge voltage of 4.4 volts).

When the battery is at a high temperature (e.g., above 45 degrees Celsius), during charging, the cathode material, $LiCoO_2$, becomes more active and may chemically react with the electrolyte when the cell voltage is high. Accordingly, when the battery is at a high temperature, charge current and/or charge voltage is reduced to limit this chemical reaction. For example, when the battery is at a high temperature, the charge rate may be reduced to 0.25 C (e.g., with a charge voltage of 4.2 volts). Above a limit temperature (e.g., 60 degrees Celsius), the battery is not charged at all (e.g., with a charge current of 0 amps and a charge voltage of 0 volts).

When a temperature of the battery is within a predetermined temperature range (e.g., above 25 degrees Celsius and below 45 degrees Celsius), the battery may be charged at a greater rate (e.g., with a greater charge current) compared to when the battery is at the low temperature or the high temperature. For example, when the temperature of the battery is within the predetermined temperature range, the charge rate may be between 0.5 C (e.g., between 80 percent battery charge level and 100 percent battery charge level) and 1.0 C (e.g., up to 50 percent battery charge level).

Disclosed herein are apparatuses, systems, and methods for optimizing thermal management of a computing device, while also maximizing a charge rate for a battery of the computing device. The battery is integrated with a dynamic vapor chamber operable to regulate a temperature of the battery to maximize a time the battery is within the predetermined temperature range for optimal charging. The dynamic vapor chamber includes a wick structure that fluidly connects working fluid reservoirs of the dynamic vapor chamber (e.g., on opposite sides of the dynamic vapor chamber). The wick structure may, for example, be disposed (e.g., 3D-printed) directly onto a housing surface of the computing device. The wick structure includes one or more controllable valves operable to regulate an amount of a working fluid to different regions of the dynamic vapor chamber.

The dynamic vapor chamber supports the battery and a charger electrically connected to the battery. For example, the battery and the charger abut a same side of the dynamic vapor chamber, and the charger abuts the battery or is positioned adjacent to the battery. The charger is operable to control the charge current for the battery.

Depending on a position of the one or more controllable valves, the dynamic vapor chamber may transfer heat from the charger to the battery and/or spread heat from the battery. The battery includes a temperature sensor operable to determine a temperature of the battery. The determined temperature is compared to a first predetermined temperature (e.g., 25 degrees Celsius), a second predetermined temperature (e.g., 45 degrees Celsius), and/or a third predetermined temperature (e.g., 60 degrees Celsius).

Based on the comparisons, if the determined temperature is less than, or less than or equal to the first predetermined temperature, the working fluid to regions of the dynamic vapor chamber adjacent to the battery and the charger, respectively, is reduced or blocked by setting the one or more controllable valves of the wick structure of the dynamic vapor chamber to an "off" position (e.g., a closed position). Setting the one or more controllable valves to the closed position creates "dry-out" of the dynamic vapor chamber, and a cooling capability of the dynamic vapor chamber is reduced. As a result, the charger heats up the battery via, for example, the Joule heating effect, and conductive heat transfer through the dynamic vapor chamber and radiative heat transfer. As the charger heats up the battery, the charge rate to the battery may be increased by the charger based on the comparison (e.g., based on a difference between the first predetermined temperature and the determined temperature). Alternatively, the charge rate to the battery may be set (e.g., 0.2 C) while the determined temperature of the battery is less than the first predetermined temperature.

Based on the comparison, if the determined temperature is greater than or equal to, or greater than the first predetermined temperature, dynamic vapor chamber cooling is maximized by setting the one or more controllable valves of the wick structure of the dynamic vapor chamber to an "on" position (e.g., an open position). The working fluid is allowed to flow between the reservoirs of the dynamic vapor chamber when the one or more controllable valves are set to the open position.

Based on the comparison, if the determined temperature is greater than or equal to, or greater than the first predetermined temperature, and less than or equal to, or less than the second predetermined temperature, the charge current is maximized. The maximum charge current may be based on a charge level of the battery. For example, the charger may set the charge rate to 1.0 C up to 50 percent charge of the battery, to 0.7 C up to 80 percent charge of the battery, and to 0.5 C up to 100 percent charge of the battery.

Based on the comparison, if the determined temperature is greater than, or greater than or equal to the second predetermined temperature, the charge current is reduced. For example, the charger may set the charge current to 25 percent of the maximum charge current. If the determined temperature is greater than, or greater than or equal to the third predetermined temperature, the charging is stopped.

The apparatuses, systems, and methods provide optimal thermal management while also maximizing a charge rate for a battery and prolonging life of the battery. The apparatuses, systems, and methods provide battery fast charge, an increased life expectancy for the battery and the computing device, in which the battery is installed, and improved user experiences and safety.

As an example, the optimal thermal management with maximized charge rate is provided by a computing device including a dynamic phase change device, a battery, a sensor, and a first heat generating component. The dynamic phase change device includes a wick structure with a valve. The valve is operable to regulate a working fluid of the dynamic phase change device based on a position of the valve. The battery is physically connected to and in thermal communication with the dynamic phase change device. The sensor is operable to determine a temperature of the battery. The first heat generating component is physically and thermally connected to the dynamic phase change device. The first heat generating component or a second heat generating component is configured to compare the determined temperature to a predetermined temperature, and control the valve based on the comparison.

Such apparatuses, systems, and methods have several potential end-uses or applications, including any electronic device to be charged. For example, the dynamic vapor chamber and control may be incorporated into personal computers, server computers, tablet or other handheld computing devices, laptop or mobile computers, gaming devices, communications devices such as mobile phones, multiprocessor systems, microprocessor-based systems, set top boxes, programmable consumer electronics, network PCs, minicomputers, mainframe computers, or audio or video media players. In certain examples, the dynamic vapor chamber and control may be incorporated within a wearable electronic device, where the device may be worn on or attached to a person's body or clothing. The wearable device may be attached to a person's shirt or jacket; worn on a person's wrist, ankle, waist, or head; or worn over their eyes or ears. Such wearable devices may include a watch, heart-rate monitor, activity tracker, or head-mounted display.

Using one or more of these features described in greater detail below, more optimized heat dissipation and a maximized charge rate may be provided for the electronic device. With the more optimized heat dissipation and maximized charge rate, a more powerful microprocessor may be installed for the electronic device, a smaller battery may be installed for the electronic device, a thinner electronic device may be designed, a higher processing speed may be provided, the electronic device may be operated at a higher power for a longer period of time, fans may be operated at a lower speed, or any combination thereof may be provided when compared to a similar electronic device without one or more of the improved features. In other words, the features described herein may provide improved thermal management and charging for an electronic device such as a mobile phone, tablet computer, or laptop computer.

FIG. 1 shows a top view of a computing device 100 including an example of a thermal management system 102. The computing device 100 may be any number of computing devices including, for example, a personal computer, a server computer, a tablet or other handheld computing device, a laptop or mobile computer, a communications device such as a mobile phone, a multiprocessor system, a microprocessor-based system, a set top box, a programmable consumer electronic device, a network PC, a minicomputer, a mainframe computer, or an audio and/or video media player.

The computing device 100 includes a housing 104 that supports at least the thermal management system 102, a processor 106, and a power source module 108. The processor 106 and the power source module 108 may be supported by the housing 104 via, for example, a printed circuit board (PCB) 110 attached to and/or supported by the housing 104. The computing device 100 may include, additional, fewer, and/or different components. For example, the computing device 100 may include one or more additional processors, memory, a power supply, a graphics card, a hard drive, other electronic components, connectors, cabling, other components, or any combination thereof. In one example, the computing device 100 does not include the processor 106 but includes one or more processors within the power source module 108.

The thermal management system 102 includes at least one phase change device. For example, the power source module 108 includes a vapor chamber (see FIGS. 2-4). In other examples, the phase change device of the power source module 108 may be a different type of phase change device (e.g., a heat pipe), and/or the computing device 100 may include additional phase change devices.

In one example, the thermal management system 102 includes a heat spreader 111 (e.g., a vapor chamber or a solid piece of thermally conductive material of the power source module 108) and a heat pipe 112 that extends between the processor 106 and the power source module 108 (e.g., the heat spreader 111 of the power source module 108. The heat pipe 112 may be physically connected to the processor 106 in any number of ways including, for example, with a thermal adhesive. The heat pipe 112 may be physically connected directly to the processor 106, or the heat pipe 112 may be physically connected to the processor 106 via one or more intervening components and/or layers of material.

In one example, the thermal management system 102 also includes one or more fans 113 (e.g., a fan). The fan 113 actively cools the processor 106, the power source module 108, and/or other heat generating components of the computing device 100, moving heat out of the computing device 100 via vents in the housing 104 of the computing device 100. In other examples, the thermal management system 102 includes additional, fewer, and/or different components including, for example, additional fans, additional phase change devices that extend from the processor 106 to housings of the fan 113 and/or the additional fans, respectively, one or more heat sinks, or any combination thereof. In one example, the computing device 100 does not include a fan.

The processor 106 is in communication with other electrical devices or components of the computing device 100 (e.g., the power source module 108 and the fan 113) via the PCB 110, cabling, wirelessly, or any combination thereof. For example, the processor 106 is electrically connected to the power source module 108 (e.g., see communication path 114) and the fan 110 (e.g., see communication path 116).

The processor 106 provides, for example, instructions to the power source module 108 (e.g., power to be provided to the processor 106 and/or the fan 113), and the power source module 108 provides electrical power and/or data (e.g., storage level or temperature for a power source 117 of the power source module 108) to the processor 106 via the communication path 114, for example. Additional and/or different data and/or power may be transmitted between the processor 106 and the power source module 108 via the communication path 114 and/or other communication paths. The communication path 114 may include one or more electrical connections between the processor 106 and the power source module 108 (e.g., one or more traces on the PCB 110 and/or one or more cables).

The processor 106 provides, for example, instructions to the fan 113 (e.g., when to change speed and by how much), and the fan 113 provides data (e.g., current speed data) to the processor 106 via the communication path 116, for example. Additional and/or different data and/or power may be transmitted between the processor 106 and the fan 113 via the communication path 116 and/or other communication paths. The communication path 116 may include one or more electrical connections between the processor 106 and the fan 113 (e.g., one or more traces on the PCB 110 and/or one or more cables).

In one example, the power source module 108 and the fan 113 are electrically connected via communication path 118. The power source module 108 provides, for example, electrical power to the fan 113, and the fan 113 provides data (e.g., a target speed or a target power) to the power source module 108 via the communication path 118, for example. Additional and/or different data and/or power may be transmitted between the power source module 108 and the fan 113 via the communication path 118 and/or other communication paths. The communication path 118 may include one or more electrical connections between the power source module 108 and the fan 113 (e.g., one or more traces on the PCB 110 and/or one or more cables).

Components of the computing device 100 (e.g., the processor 106, the power source module 108, and the fan 113) are powered and/or charged via a power supply 120 outside or within the computing device 100. For example, the power supply 120 is disposed outside of the housing 104 of the computing device 100 and is electrically and physically connected to the computing device 100 via one or more connectors 122. The power supply 120 may, for example, be an AC/DC adapter that converts 120 VAC from the wall, for example, to a lower DC voltage. Other power supplies (e.g., converting from 240 VAC) may be used.

The power supply 120 may be electrically connected to the power source module 108 via the one or more connectors 122, the PCB 110 (e.g., see communication path 124), cabling, or any combination thereof. The power source (see FIGS. 2 and 4) of the power source module 108 may be charged with the lower DC voltage supplied by the power supply 120, or the power source module 108 may increase or further decrease the lower DC voltage for charging the power source 117.

When a temperature of the power source 117 (e.g., a battery) is within a temperature range (e.g., above 25 degrees Celsius and below 45 degrees Celsius), the battery 117 (e.g., a rechargeable battery) may be charged at a greater rate (e.g., with a greater charge current) compared to when the battery is outside of the temperature range. The greater rate of charge decreases an amount of time a user of the computing device 100 cannot use the computing device 100 while the computing device 100 charges.

Figure 2:
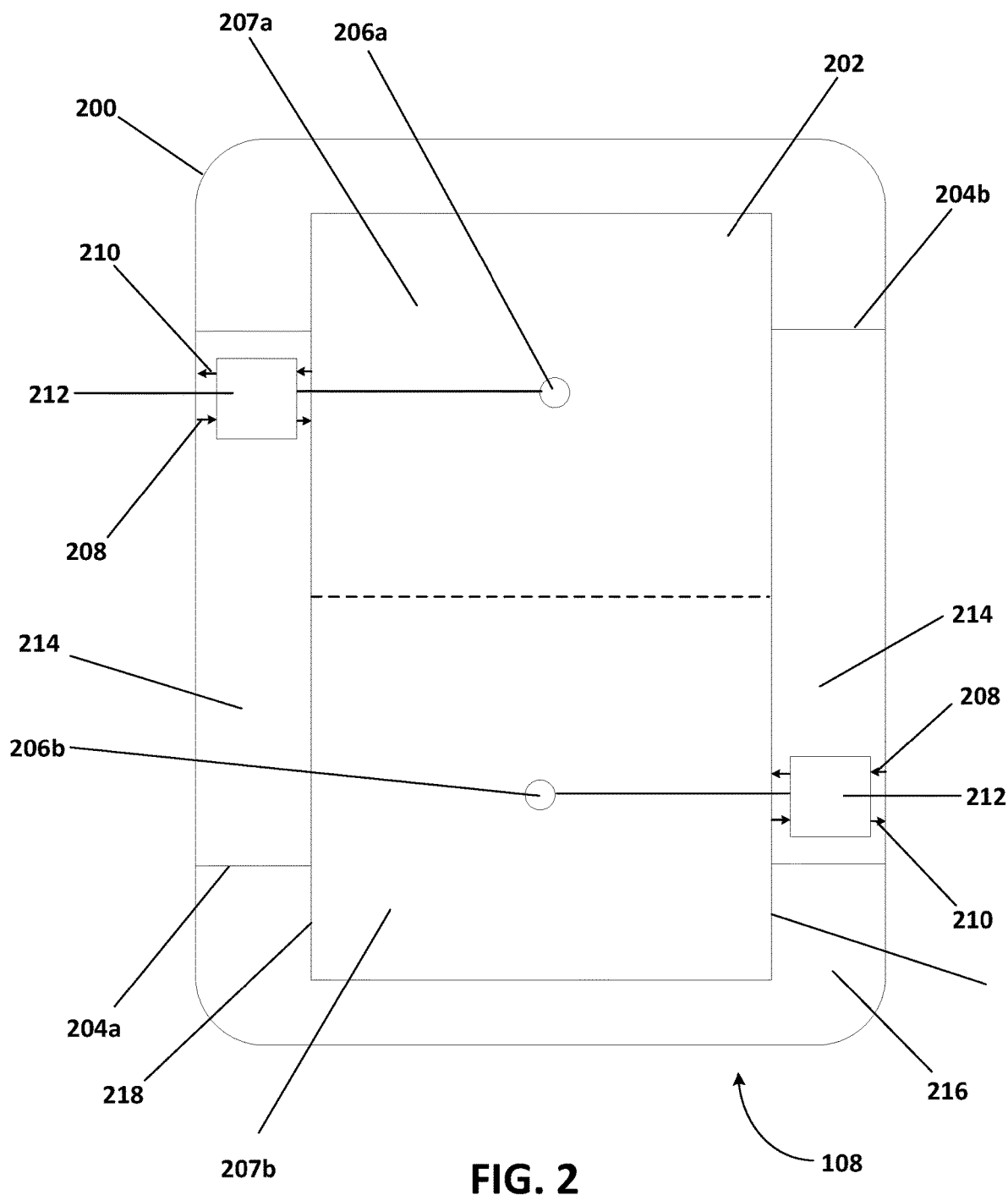
FIG. 2 depicts a top view of an example of a power source module.

Components of the power source module 108 help maintain the temperature of the battery within the temperature range. FIG. 2 shows a top view of one example of the power source module 108. The power source module 108 includes a dynamic vapor chamber 200, a battery 202 supported by the dynamic vapor chamber 200, at least one charger 204 (e.g., two chargers) supported by the dynamic vapor chamber 200, and at least one sensor 206 operable to determine at least one respective temperature of the battery 202 (e.g., two temperature sensors).

The battery 202 may be any number of different types of batteries including, for example, a rechargeable lithium ion battery. Other types of batteries or power sources (e.g., lithium polymer, battery fuel cells) may be provided. The battery 202 may be any number of sizes and/or shapes and may include any number of cells based on the size and shape of the battery 202. The battery 202 may have a capacity at least partially defined by the size, shape, and number of cells.

The battery 202 includes one or more cells 207 (e.g., depending on the size and storage of the battery), and within each of the one or more cells 207, lithium ions of the battery 202 carry current from a negative electrode of the respective cell 207 to a positive electrode of the respective cell 207 during discharging, and carry current from the positive electrode of the respective cell 207 to the negative electrode of the respective cell 207 during charging. An electrolyte within the cell 207 allows for the ionic movement. Heat is generated during both the charging and the discharging of the battery 202. The generated heat includes, for example, Joule heat and reaction heat and may depend on charging or discharging voltage and current.

The two chargers 204 control voltage and current to the battery 202 during charging, and control the voltage and the current to the battery to other components within the computing device 100 during discharging (e.g., see charging communication paths 208 and discharging communication paths 210). In one example, the two chargers 204 control charging and discharging of two cells 207a and 207b of the battery 202, respectively.

Each of the two chargers 204 may be, for example, a protection circuit module (PCM) or protection circuit board that protects the battery 202 from overcharging, over-discharging, and over-drain. Each of the two chargers 204 includes any number of electrically connected components 212 including, for example, a voltage converter/regulator circuit, a voltage tap, a battery charge state monitor, one or more connectors, or any combination thereof. The PCMs each include circuit boards 214 via which the components 212 are electrically connected. At least one of the components 212 of the respective charger 204 may include a processor configured to control the charging and discharging of the battery 202. The components 212 of the chargers 204 are electrically connected to the battery 202.

The two temperature sensors 206 may be any number of different types of temperature sensors including, for example, a thermocouple, a resistance temperature detector (RTD) (e.g., a resistance wire RTD or a thermistor), or another type of temperature sensor. All of the temperature sensors may be the same type of temperature sensor, or different types of temperature sensors may be used within the electronic device. The power source module 108 may include more or fewer temperature sensors.

The two temperature sensors 206 are in communication with components 212 (e.g., the processors) of the chargers 204 (e.g., via wires and/or traces of the circuit boards 214 of the chargers 204), respectively. For example, a first temperature sensor 206a of the two temperature sensors 206 is positioned within a first cell 207a of the two cells 207, and a second temperature sensor 206b of the two temperature sensors 206 is positioned within a second cell 207b of the two cells 207. The first temperature sensor 206a and the second temperature sensor 206b are in communication with the processors 212 of a first charger 204a and a second charger 204b of the two chargers, respectively. The two temperature sensors 206a and 206b may be located at positions on or within the battery 202, at which temperatures of the battery 202 are a maximum, respectively.

The two temperature sensors 206a and 206b determine temperatures at, for example, the positions within the first cell 207a and the second cell 207b, respectively, and return the determined temperatures to the processors 212 of the respective chargers 204a and 204b. The two temperature sensors 206a and 206b may determine the temperatures continuously or at predetermined intervals.

The two chargers 204a and 204b are supported by a same surface 216 of the dynamic vapor chamber 200, on opposite sides of the battery 202. For example, the first charger 204a is supported by the surface 216 of the dynamic vapor chamber 200, abutting or adjacent to a first side 218 of the battery 202, and the second charger 204b is supported by the surface 216 of the dynamic vapor chamber 200, abutting or adjacent to a second side 220 of the battery 202. The second side 220 of the battery 202 is opposite the first side 218 of the battery 202. In one example, the battery 202 and the circuit boards 214 of the chargers 204 are attached to the surface 216 of the dynamic vapor chamber 200 in any number of ways including, for example, with a thermal adhesive. Connectors such as, for example, screws and tapped bosses in the dynamic vapor chamber 200 may be used instead of or in addition to the thermal adhesive.

The first charger 204a abutting the first side 218 of the battery 202 may be a component 212 of the first charger 204a or the circuit board 214 of the first charger 204a abutting the first side 218 of the battery 202, and the second charger 204b abutting the second side 220 of the battery 202 may be a component 212 of the second charger 204b or the circuit board 214 of the second charger 204b abutting the second side 220 of the battery 202. The first charger 204a being adjacent to the first side 218 of the battery 202 may be a component 212 of the first charger 204a or the circuit board 214 of the first charger 204a being positioned a small distance (e.g., within 1.0 cm) from the first side 218 of the battery 202, and the second charger 204b being adjacent to the second side 220 of the battery 202 may be a component 212 of the second charger 204b or the circuit board 214 of the second charger 204b being positioned a small distance (e.g., within 1.0 cm) from the second side 220 of the battery 202.

In other examples, the two chargers 204a and 204b are respectively supported by opposite surfaces of the dynamic vapor chamber 200, the two chargers 204a and 204b are disposed adjacent to a same side of the battery 202, or the power source module 108 only includes one charger 204. In one example, additional chargers 204 abut or are positioned adjacent to additional and/or different sides of the battery 202 for charging additional cells 207 of the battery 202, respectively.

Heat generated during operation of the power source module 108 includes Joule heat generated by the components 212 of the two chargers 204a and 204b, in addition to the Joule heat and reaction heat generated during the charging and discharging of the battery 202. The dynamic vapor chamber 200 aids in the cooling (e.g., heat spreading and ultimate heat removal from the computing device 100) of at least the two chargers 204a and 204b (e.g., the components 212 of the two chargers 204a and 204b) and the battery 202 during operation of the power source module 108.

The dynamic vapor chamber 200 may act as a heat flux transformer that cools a high heat flux from the battery cells 207 and/or the components of the two chargers 204a and 204b and transforms the high heat flux into a lower heat flux for removal. An internal structure of the dynamic vapor chamber 200 is important for phase change performance. Features that affect phase change performance include vapor space and capillary features. The vapor space is a path for evaporated working fluid to travel to a condenser, and the capillary features are a pathway for condensed working fluid to return to an evaporator.

Figure 3:
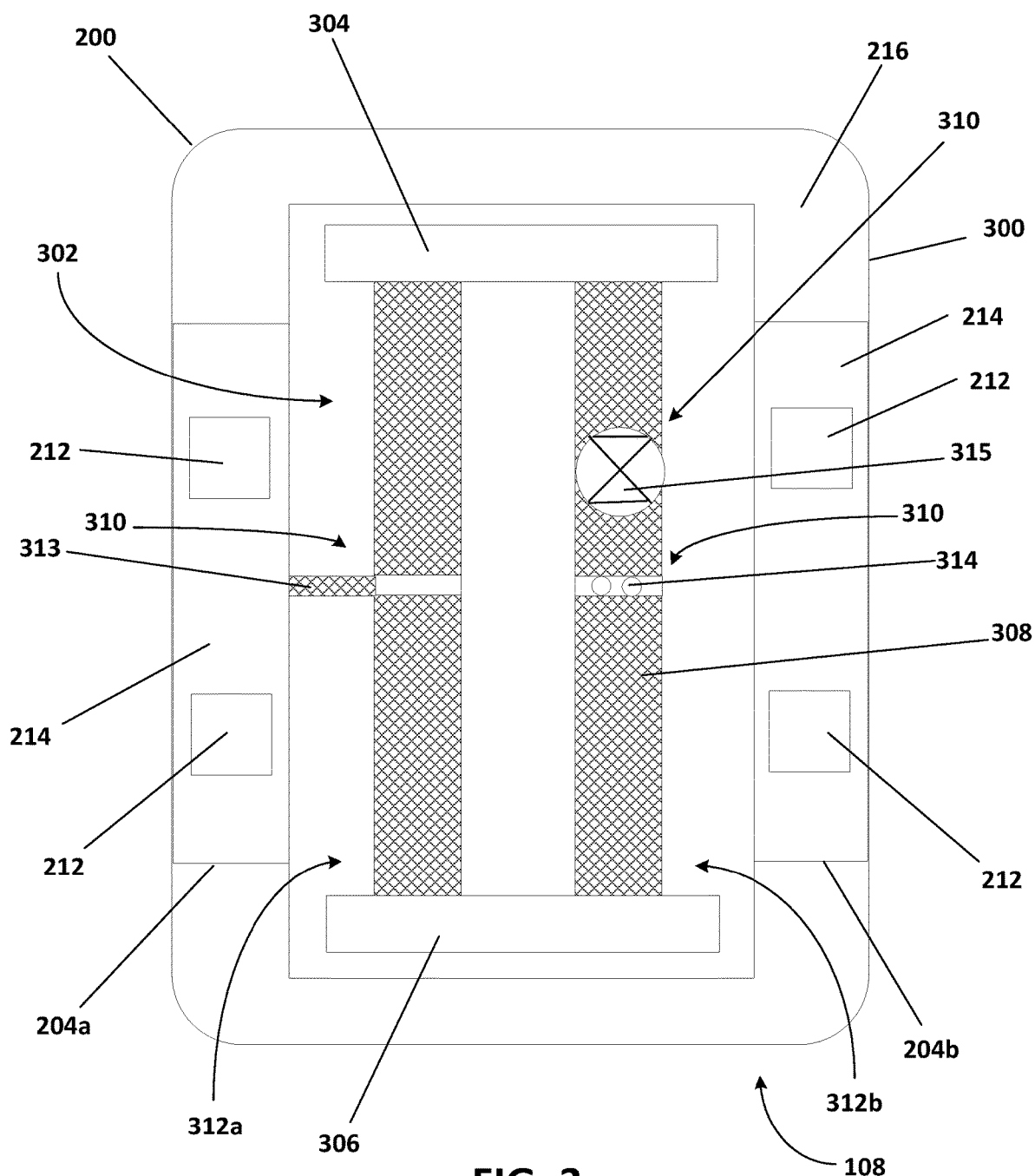
FIG. 3 depicts a top view of an example of a power source module with a battery and a portion of a phase change device removed.

FIG. 3 depicts a top view of an example of the power source module 108 with the battery 202 and a portion of the dynamic vapor chamber 200 removed. The dynamic vapor chamber 200 may be any number of sizes, shapes, and/or may be made of any number of materials. For example, the dynamic vapor chamber 200 may be rectangular in shape (e.g., with rounded corners) and may be sized based on sizes of the battery 202 and the chargers 204, respectively. In one example, the dynamic vapor chamber is sized such that an entire surface (e.g., a bottom surface) of the battery 202 and entire surfaces (e.g., bottom surfaces) of the chargers 204 abut the surface 216 of the dynamic vapor chamber 200 (e.g., to match a combined size of the battery 202 and the chargers 204). In one example, the width of the dynamic vapor chamber 200 is greater than a combined width (e.g., in a direction perpendicular to the first side 218 and the second side 220 of the battery 202) of the battery 202 and the chargers 204, and the length of the dynamic vapor chamber 200 is greater than the length (e.g., in a direction parallel to the first side 218 and the second side 220 of the battery 202) of the battery 202 and the lengths of the chargers 204. Other shapes and/or sizes may be provided. The dynamic vapor chamber 200 may be made of, for example, copper, aluminum, titanium, one or more other thermally conducting materials, or any combination thereof. Different parts of the dynamic vapor chamber 200 may be made of different or a same material.

The dynamic vapor chamber 200 includes a housing 300 (e.g., with the outer surface 216), a capillary recirculation system 302, and a working fluid (not shown) such as, for example, water, ammonia, alcohol, or ethanol. The capillary recirculation system 302 includes a first reservoir 304 and a second reservoir 306 for the working fluid, and a wick structure 308 (e.g., capillary features) that extends between the first reservoir 304 and the second reservoir 306. In one example, the first reservoir 304 and/or the second reservoir 306 is an extension of the wick structure 308. In another example, the first reservoir 304 and/or the second reservoir 306 is a different type of wick structure than the wick structure 308.

The wick structure 308 may include a plurality of pins, screen wick structures, open channels, channels covered with screens, an annulus behind a screen, an artery structure, a corrugated screen, other structures, or any combination thereof. The wick structure 308 may extend along the length of the dynamic vapor chamber 200, along the width of the dynamic chamber 200, and/or in any number of other directions. The wick structure 308 may include a single path for the working fluid or a number of separate paths (e.g., two paths, as shown in FIG. 3). In one example, the wick structure 308 covers all inner surfaces of the housing 300 of the dynamic vapor chamber 200.

The wick structure 308 also includes one or more valves 310 operable to regulate an amount of working fluid to different regions of the dynamic vapor chamber 200. The valves 310 may, for example, be active capillary features in that a wicking capability of the active capillary features may be controlled. For example, as shown with a first wick structure path 312a in FIG. 3, a portion 313 of the wick structure 308 (e.g., a valve 310) may be moved translationally and/or rotationally from a position within the first wick structure path 312a (e.g., a valve "on" position) to a position out of the first wick structure path 312a (e.g., a valve "off" position). A portion of the working fluid flowing through the first wick structure path 312a is diverted out of the first wick structure path 312a, and/or the lesser length of the wick structure path 312a through which the working fluid may flow leads to a higher heat flux and eventual dry-out. In other words, the heat flux may increase to a point where the working fluid does not return to the heat source (e.g., adjacent a hot spot on the battery 202), and the working fluid remains in the first reservoir 304 and the second reservoir 306.

In another example, as shown with a second wick structure path 312b in FIG. 3, the wick structure 308 includes a plurality of pins 314, and a subset of pins (e.g., two pins acting as the valves 310) of the plurality of pins 314 are active and controllable by a processor (e.g., the processor 106 and/or the processor 212). In one example, all pins of the plurality of pins 314 are controllable by a processor (e.g., the processor 106 or the processor 212). In another example, the second wick structure path 312b includes a single active and controllable pin 314. The wick structure 308 within the second wick structure path 312b may be formed entirely by pins 314. Alternatively, a first portion of the second wick structure path 312 may be formed by a first type wick structure 308, and a second portion of the second wick structure path 312 may be formed by a second type of wick structure 308 (e.g., the pins 314 acting as the valve 310).

The two active pins 314, for example, are movable between an activated state (e.g., a valve "on" position) and a deactivated state (e.g., a valve "off" position). For example, the active pins 314 are movable from the activated state to the deactivated state in a direction into the housing 300 of the dynamic vapor chamber 200. In other words, in the activated state, the active pins 314 extend away from an inner surface of the housing 300 of the dynamic vapor chamber 200, and in the deactivated state, the active pins 314 are disposed within a wall of the housing 300, thus creating a gap within the second wick structure path 312b. The active pins 314 may be translatable or rotatable between the activated state and the deactivated state.

By moving the active pins 314 into the deactivated state, for example, the first reservoir 304 is cut off from the second reservoir 306. Condensed liquid pools up in the first reservoir 304 and the second reservoir 306 and does not return to an evaporator (e.g., adjacent a hotspot on the battery 202) when the active pins 312 are in the deactivated state if the heat flux from the battery 202 rises to a high enough level. As the liquid within the wick structure 308 dries up, the dynamic vapor chamber 200 is less able to aid in heat spreading and heat removal.

Alternatively or additionally, the valve 310 may include a fluid control valve 315 that regulates an amount of working fluid that is able to flow between the first reservoir 304 and the second reservoir 306. The fluid control valve 315 may be controlled by the processor (e.g., the processor 106 or the processor 212) via, for example, a magnetic switch of the fluid control valve 315. In one example, the fluid control valve 315 is controlled by a magnetic field generated outside of the dynamic vapor chamber 200.

The valves 310 may be movable between the valve "on" position and the valve "off" position in any number of ways including, for example, mechanically using a motor and linkages, and/or using microelectromechanical (MEMS) technology. In one example, the valves 310 are controlled by magnetic switches. In other examples, electrowetting or electric fields may be generated at at least a portion of the wick structure 308 to control the wicking capability of the portion of the wick structure 308. FIG. 3 shows examples of two different valves 310. In other examples, each of the separate wick structure paths 312a and 312b may have a same type of valve 310. Additional, different, and/or fewer valves may be used within the wick structure 308.

In one example, as shown in FIG. 1, the heat pipe 112 extending between the processor 106 and the power source module 108 includes a valve 126. Instead of or in addition to control of the valve 310, the valve 126 of the heat pipe 112 may be controlled (see FIG. 5) to regulate flow of a working fluid moving through the heat pipe 112 and thus, heat transfer from the processor 106, for example, to the power source module 108. The thermal communication between the processor 106 and the battery 117, for example, may be used in conjunction with control of the valve 126 of the heat pipe 112 to maximize an amount of time the temperature of the battery 117 is within a predetermined temperature range. For example, when the temperature of the battery 117 is below the predetermined temperature range, the processor 106 may open the valve 126 such that heat generated by the processor 106 is transferred to the battery 117 via the working fluid within the heat pipe 112 and the heat spreader 111, and the temperature of the battery 117 is increased. The processor 106 may close the valve 126 once the temperature of the battery 117 reaches the predetermined temperature range.

Referring to FIGS. 2 and 3, the heat generated by the battery 202 and the chargers 204 is spread by the dynamic vapor chamber 200 and ultimately conducted through the housing 104 of the computing device 100 and removed from the computing device 100 through convection and radiation. In order to reduce a thermal resistance for this heat flow from the battery 202 and the chargers 204 and ultimately out of the computing device 100, the dynamic vapor chamber 200 may be integrated with the housing 104 of the computing device 100.

Figure 4:
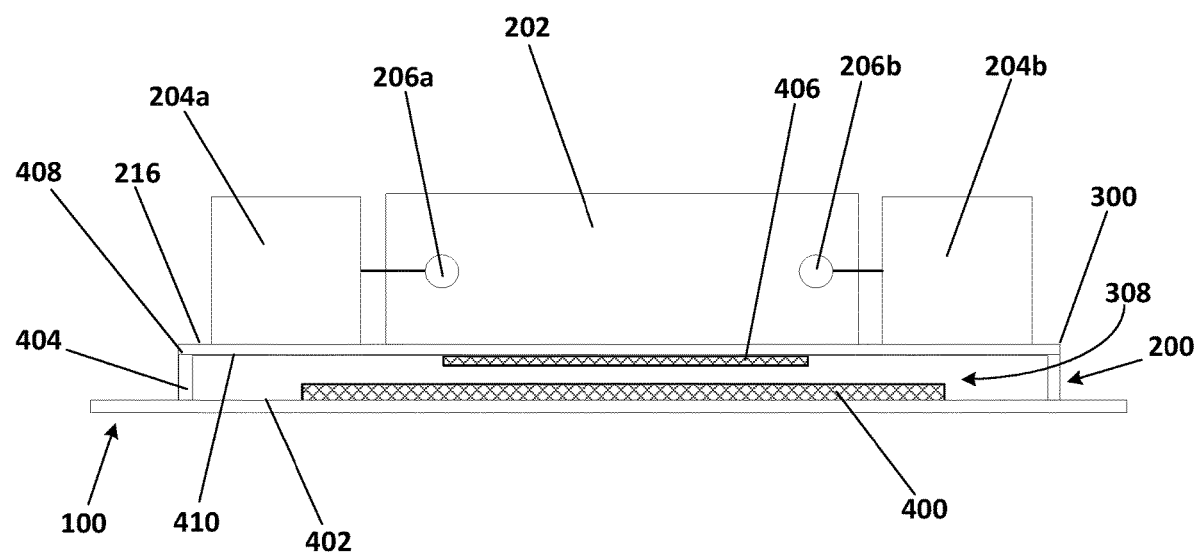
FIG. 4 depicts a cross section of an example of a power source module.

For example, as shown in the example of FIG. 4, a portion of the housing 300 of the dynamic vapor chamber 200 is formed by a portion of the housing 104 of the computing device 100. A thermal resistance between the battery 202 and the chargers 204, and the housing 104 is reduced, allowing for more efficient cooling of the battery 202 and the chargers 204. In one example, at least a first portion 400 of the wick structure 308 is disposed on an inner surface 402 of the housing 104 of the computing device 100. The first portion 400 of the wick structure 308 may be disposed on the inner surface 402 of the housing 104 of the computing device 100 in any number of ways including, for example, by three-dimensional (3D) printing. In other examples, the first portion 400 of the wick structure 308 and/or other components of the dynamic vapor chamber 200 are disposed (e.g., 3D printed) on other surfaces (e.g., an enclosure plate) within the computing device 100.

In one example, the first portion 400 of the wick structure 308 and walls 404 of the dynamic vapor chamber 200 are 3D printed directly onto the inner surface 402 of the housing 104. The first portion 400 of the wick structure 308 and/or the walls 404 of the dynamic vapor chamber 200 may be disposed on the inner surface 402 in other ways. For example, the first portion 400 of the wick structure 308 and/or the walls 404 may be preformed and adhered (e.g., with an adhesive or welds) to the inner surface 402 of the housing 104 of the computing device 100. In one example, the housing 300 of the dynamic vapor chamber 200 is entirely separate from the housing 104 of the computing device 100.

In one example, the wick structure 308 also includes a second portion 406. The dynamic vapor chamber 200 includes a plate 408 that abuts the walls 404 extending away from the inner surface 402 of the housing 104. The plate 408 includes the surface 216 on which the battery 202 and the chargers 204 are supported (e.g., a first surface), and a second surface 410 opposite the first surface 216. The second surface 410 is an inner surface of the dynamic vapor chamber 200 and is opposite the inner surface 402 of the housing. The second portion 406 of the wick structure 308 is disposed (e.g., 3D printed) on the second surface 410 of the plate 408. In one example, portions of the wick structure 308 are disposed on the walls 404. The wick structure 308 may be disposed on all or less than all of the inner surface 402 of the housing 104, the walls 404, and/or the plate 408 within the dynamic vapor chamber 200.

In one example, the plate 408 includes an opening the size of the battery 202, and the battery 202 is at least partially disposed within the opening in the plate 408. All or part of the second portion 406 of the wick structure 308 is disposed on an outer surface of the battery 202 and not the plate 408. For example, the second portion 406 of the wick structure 308 may be 3D printed directly onto the outer surface of the battery 202.

When the valves 310 of the wick structure 308 are in the "on" position, all of the working fluid is free to flow through all of the wick structure 308, and the dynamic vapor chamber 200 better spreads heat generated by the battery 202 and the chargers 204 compared to when the valves 310 are in the "off" position. When the valves 310 are in the "off" position" and, for example, the dynamic vapor chamber 200 does not spread heat as well as when the valves 310 are in the "on position" and/or dries out, the battery 202 may heat up due to the Joule heat generated by the components 212 of the two chargers 204a and 204b (e.g., via radiation, conduction, and/or convection), and the Joule heat and reaction heat generated by the battery 202. This thermal communication between the battery 202 and the chargers 204 may be used in conjunction with control of the valves 310 of the dynamic vapor chamber 200 to maximize an amount of time the temperature of the battery 202 is within the predetermined temperature range.

Figure 5:
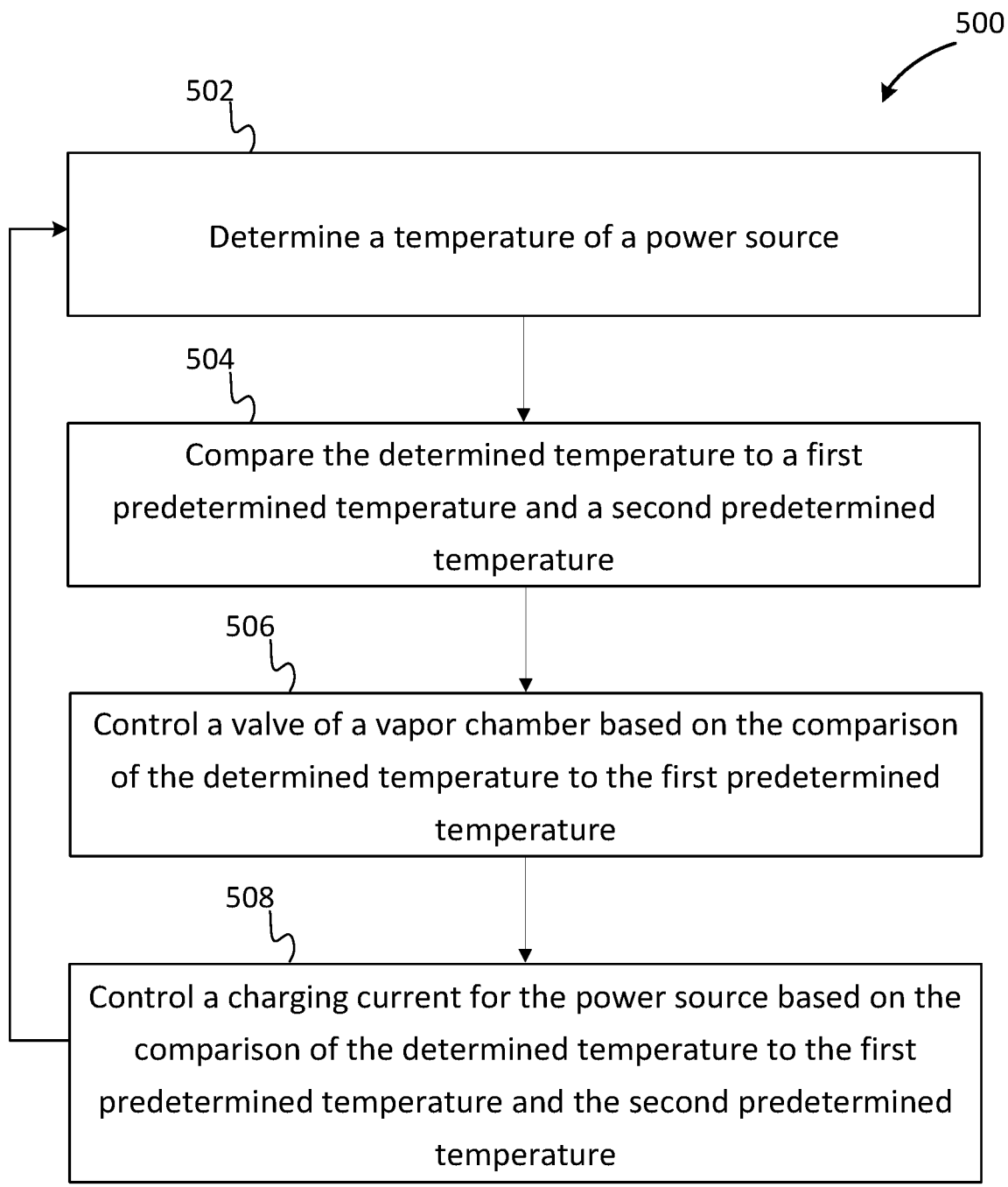
FIG. 5 is a flow diagram of a method for optimizing charging of a power source of a computing device in accordance with an example.

FIG. 5 shows a flowchart of one example of a method 500 for optimizing charging of a power source of a computing device. The method 500 is implemented in the order shown, but other orders may be used. Additional, different, or fewer acts may be provided. Similar methods may be used for transferring heat.

In act 502, one or more sensors (e.g., a sensor) determine a temperature of a power source. The sensor is positioned on and/or in the power source (e.g., at a hot spot in the power source). The sensor may be any number of different types of sensors including, for example, a thermocouple, a resistance temperature detector (RTD) (e.g., a resistance wire RTD or a thermistor), or another type of temperature sensor. The power source may be any number of different types of power sources including, for example, a battery (e.g., a lithium ion battery). Other power sources such as, for example, a fuel cell may be provided.

The sensor is electrically connected to a processor and return the determined temperature to the processor. The sensor may determine the temperature and return the determined temperature to the processor continuously or at a predetermined interval. The processor may be a processor of a charger for the battery or may be a different processor of the computing device. In one example, the processor is formed by a plurality of processors of separate controllers for different cells of the battery, respectively. In another example, the processor includes the plurality of processors of the separate controllers and/or one or more processors of the computing device.

In one example, the battery is part of a power source module that also includes one or more chargers (e.g., two chargers) and a controllable phase change device (e.g., a vapor chamber). The two chargers, for example, control charging and discharging current and voltage for different cells within the battery, respectively. The two chargers are disposed on opposite sides of the battery, and are supported by a same side of the vapor chamber. The vapor chamber supports the two chargers and the battery in that two chargers and the battery abut the vapor chamber or the two chargers and the battery are physically connected to the vapor chamber via one or more intervening layers of material and/or components. The two chargers are positioned adjacent to the battery or abut the battery. In one example, two sensors are positioned on and/or in the battery (e.g., within the different cells of the battery). The two sensors determine respective temperatures within the battery and return the determined temperatures to one of the chargers or the two chargers (e.g., processors of the two chargers), respectively.

In act 504, a processor compares the determined temperature to a first predetermined temperature and a second predetermined temperature. The second predetermined temperature is greater than the first predetermined temperature. The first predetermined temperature and the second predetermined temperature define a predetermined temperature range for the battery, within which charging is optimized. For example, the first predetermined temperature is 25 degrees Celsius, and the second predetermined temperature is 45 degrees Celsius. Other predetermined temperatures may be used.

In one example, the processor also compares the determined temperature to a third predetermined temperature. The third predetermined temperature is greater than the second predetermined temperature. The third predetermined temperature may define, for example, a maximum operating temperature for the battery and may thus represent a temperature of the battery at which charging and/or discharging is to be stopped.

Comparing the determined temperature to the first predetermined temperature and the second predetermined temperature may include the processor determining whether the determined temperature is less than, equal to, or greater than the first predetermined temperature, and whether the determined temperature is less than, equal to, or greater than the second predetermined temperature. In one example, comparing the determined temperature to the third predetermined temperature include the processor determining whether the determined temperature is less than, equal to, or greater than the third predetermined temperature.

In act 506, the processor controls a valve of a vapor chamber based on the comparison of the determined temperature to the first predetermined temperature. The vapor chamber includes capillary features (e.g., a wick structure) and a working fluid that moves through the capillary features. The capillary features may include a plurality of pins, screen wick structures, open channels, channels covered with screens, an annulus behind a screen, an artery structure, a corrugated screen, other structures, or any combination thereof. In one example, the vapor chamber includes multiple wick structure paths, and respective controllable valves are operable to regulate (e.g., divert, restrict, or block) the flow of working fluid based on the comparison. Different valves may be controlled based on different predetermined temperatures.

In one example, a portion of the capillary features acts as the valve. For example, the capillary features include, for example, movable pins (e.g., into a housing of the vapor chamber) and/or a movable portion of a corrugated screen such that a path between reservoirs on opposite sides of the vapor chamber and/or a path between an evaporator (e.g., adjacent to a hot spot on the battery) and a condenser (e.g., a reservoir) is broken. In another example, the vapor chamber includes another type of valve that is operable to divert a portion of the working fluid out of a path between the evaporator and the condenser such that the working fluid flowing through the capillary features eventually dries up. For example, the capillary features include an open channel, and the valve is operable to move a wall of the open channel such that at least a portion of the working fluid is diverted out of the open channel (e.g., to a reservoir outside of the open channel). In one example, the valve includes a volume, in which at least a portion of the working fluid may be stored when the valve is in a closed position. Other types of valves may be provided.

Controlling the valve includes the processor setting the valve to the closed position when the determined temperature is less than (or less than or equal to) the first predetermined temperature. The valve is operable to regulate (e.g., divert, block, or restrict) the flow of the working fluid when the valve is in the closed position. A valve in the closed position may not entirely block the flow of the working fluid, but may divert at least a portion of the working fluid and/or restrict the flow of the working fluid, for example. With the flow of the working fluid blocked or restricted, a cooling capability of the vapor chamber is reduced, and the vapor chamber may eventually dry out. The battery heats up due to the Joule heat and the reaction heat generated by the battery, and the joule heat generated by the chargers.

The valve remains in the closed position until the determined temperature of the battery reaches or exceeds the first predetermined temperature (e.g., reaches the predetermined temperature range for optimal charging of the battery of the computing device).

Controlling the valve also includes the processor setting the valve to an open position when the determined temperature is greater than or equal to (or greater than) the first predetermined temperature. The valve allows the working fluid to flow when the valve is in the open position. With the valve in the open position and the working fluid allowed to flow, heat spreading and cooling provided by the vapor chamber is maximized.

In one example, the valve is positionable in only two positions, the open position and the closed position. In another example, the valve is positionable in more than two positions, and the processor may set a partially open position of the valve based on a difference between the determined temperature and the first predetermined temperature calculated by the processor.

In act 508, the processor controls (e.g., sets) a charging current for the power source based on the comparison of the determined temperature to the first predetermined temperature and the second predetermined temperature. In one example, the processor also controls a charging voltage based on at least the comparison of the determined temperature to the first predetermined temperature and the second predetermined temperature. The processor controls the charging current via, for example, the two chargers of the power source module. The two chargers may, for example, control the charging current for two different cells of the battery, respectively. The two chargers may be any number of different types of chargers including, for example, protection circuit modules operable to control the charging current, the charging voltage, the discharging current, and the discharging voltage with components (e.g., voltage dividers, MOSFETs) of the chargers controlled by the processor. More or fewer chargers may be provided in the power source module.

The processor controlling the charging current for the battery based on the comparison of the determined temperature to the first predetermined temperature and the second predetermined temperature includes the processor setting, via the chargers, the charging current to a greater current when the determined temperature is greater than the first predetermined temperature and less than the second predetermined temperature, compared to when the determined temperature is less than the first predetermined temperature or is greater than the second predetermined temperature. For example, based on the comparisons, the processor may set the charge rate to 0.5 C to 1.0 C when the determined temperature is greater than the first predetermined temperature and less than the second predetermined temperature. The charge rate may vary when the determined temperature is greater than the first predetermined temperature and less than the second predetermined temperature due to a charge level of the battery. For example, the charge rate may be set to 1.0 C up to a 50 percent charge level, 0.7 C up to an 80 percent charge level, and 0.5 C up to a 100 percent charge level. The processor may, for example, set the charge voltage to 4.4 Volts. Other charge rates and charge voltages may be set by the processor.

The processor also sets, via the chargers, the charge rate for the battery to, for example, 0.2 C when the determined temperature is less than the first predetermined temperature, and sets the charging current to 0.25 C when the determined temperature is greater than the second predetermined temperature. The processor may, for example, also set the charge voltage to 4.4 Volts when the determined temperature is less than the first predetermined temperature, and set the charge voltage to 4.2 Volts when the determined temperature is greater than the second predetermined temperature. The processor may set the charge rate and/or the charging voltage to other values when the determined temperature is less than the first predetermined temperature and/or when the determined temperature is greater than the second predetermined temperature.

In one example, the processor also sets, via the charger, the charge rate for the battery based on the comparison of the determined temperature to the third predetermined temperature. The charge rate may, for example, be set to 0.0 C when the determined temperature is greater than the third predetermined temperature.

The method 500 is a closed-loop feedback method in that the method moves to act 502 after act 508. The temperature sensor monitors the temperature of the battery continuously or at predetermined intervals, and the processor controls the vapor chamber (e.g., a valve of the vapor chamber) and charging current and/or voltage based on the temperature of the battery.

In one example, the power source module includes more or fewer temperature sensors disposed on and/or in the battery, and the temperatures determined by the temperature sensors are averaged, and the averaged temperature is used for the comparisons. In another example, a maximum temperature and/or a minimum temperature are identified from the temperatures determined by the temperature sensors, and the maximum temperature or the minimum temperature is used for the comparisons.

The methods and systems of the present examples provide optimal thermal management while also maximizing charge rate and prolonging battery life. The optimal thermal management provided by the methods and systems of the present examples allows for fast charging batteries, increases computing device life expectancy, improves a financial margin, and improves a user experience and safety.

Figure 6:
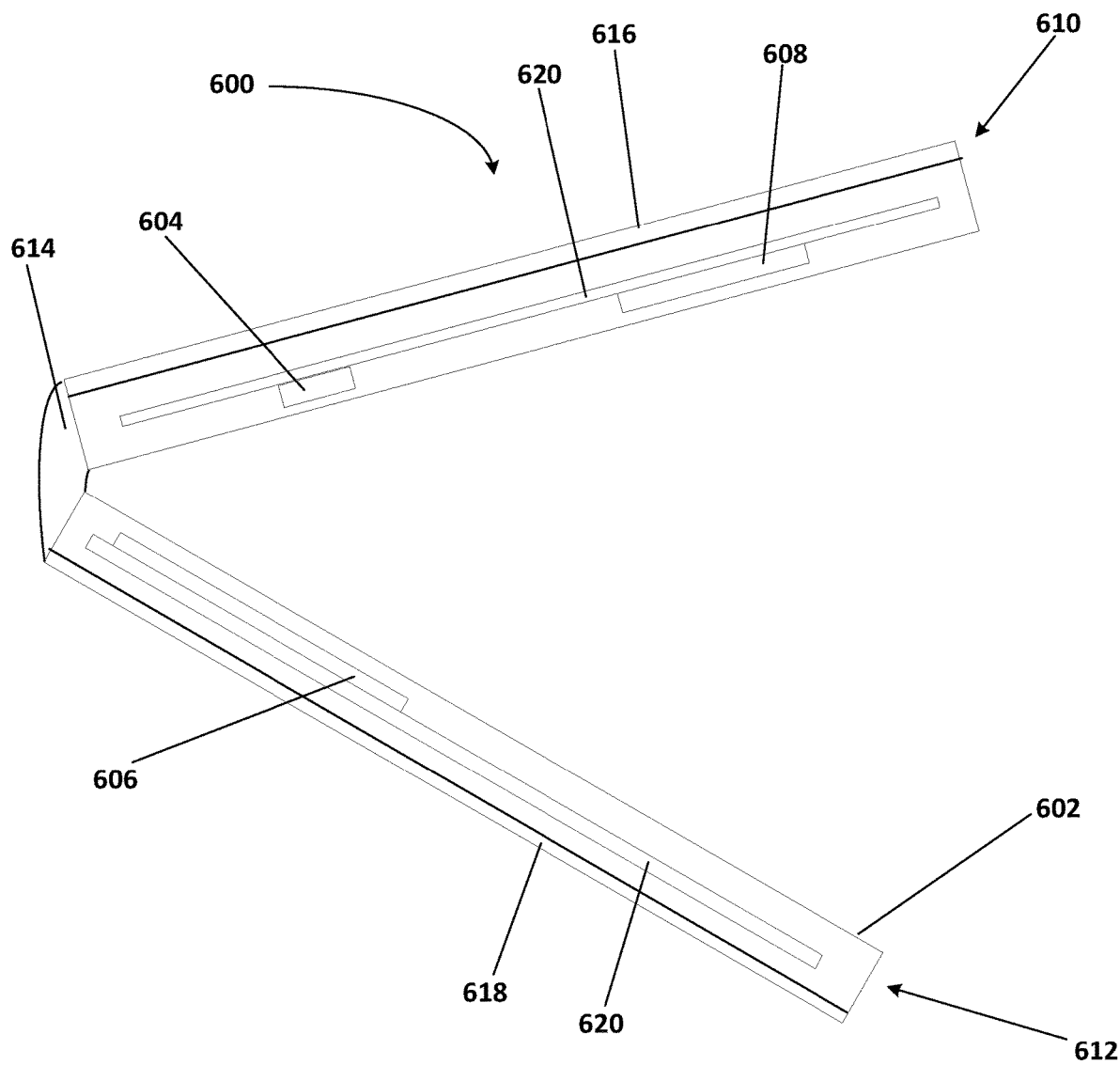
FIG. 6 depicts a side view of an example of a multi-display computing device in a transition configuration, with a side removed.

With respect to improving user experience, for a multiple screen device that includes a plurality of batteries, as shown in FIG. 6, the methods and systems of the present examples may be applied to maximize a time the plurality of batteries are charged. As shown in FIG. 6, a computing device 600 includes a housing 602 that supports one or more processors 604 (e.g., a processor), a power source module 606 that includes a first power source (e.g., a first battery), a dynamic vapor chamber (e.g., the dynamic vapor chamber 200), and one or more chargers, and a second power source 608 (e.g., a second battery).

The housing 602 includes a first portion 610 and a second portion 612 rotatably attached to the first portion 610 via a hinge 614. The first portion 610 of the housing 602 supports a first display 616, and the second portion 612 of the housing 602 supports a second display 618. The first portion 610 of the housing 602 supports the processor 604 and the second battery 608, and the second portion 612 of the housing 602 supports the power source module 606 including the first battery. The processor 604 and the second battery 608, and the power source module 606 are supported and electrically connected via respective PCBs 620.

Using the methods and systems of the present examples, if, for example, a charge level for the first battery is low (e.g., less than twenty percent full) and the determined temperature for the first battery is below the first predetermined temperature (e.g., at 20 degrees Celsius) and the determined temperature for the second battery 608 is above the second predetermined temperature (e.g., at 46 degrees Celsius). The computing device is drawing power from the first battery, and the determined temperatures for the first battery and the second battery 608, respectively, are out of the optimal temperature range for charging. Without the dynamic vapor chamber of the power source module 606, the computing device 600 may draw down an overall system battery capacity (e.g., a combination of a capacity of the first battery and a capacity of the second battery 608) faster than the first battery and the second battery 608 can be charged. If the trend continues, the computing device 600 may eventually be shut down due to system and/or battery "brown out" protection.

With the dynamic vapor chamber of the power source module 606, however, the processor 604 or a processor of the power source module 606 may send a signal to close a valve of the dynamic vapor chamber of the power source module 606 to reduce cooling for the first battery. With the cooling reduced, the temperature of the first battery rises, and a charge rate for the first battery is increased. A user is thus able to continue using the computing device 600 without disruption while the overall system battery capacity increases.

Figure 7:
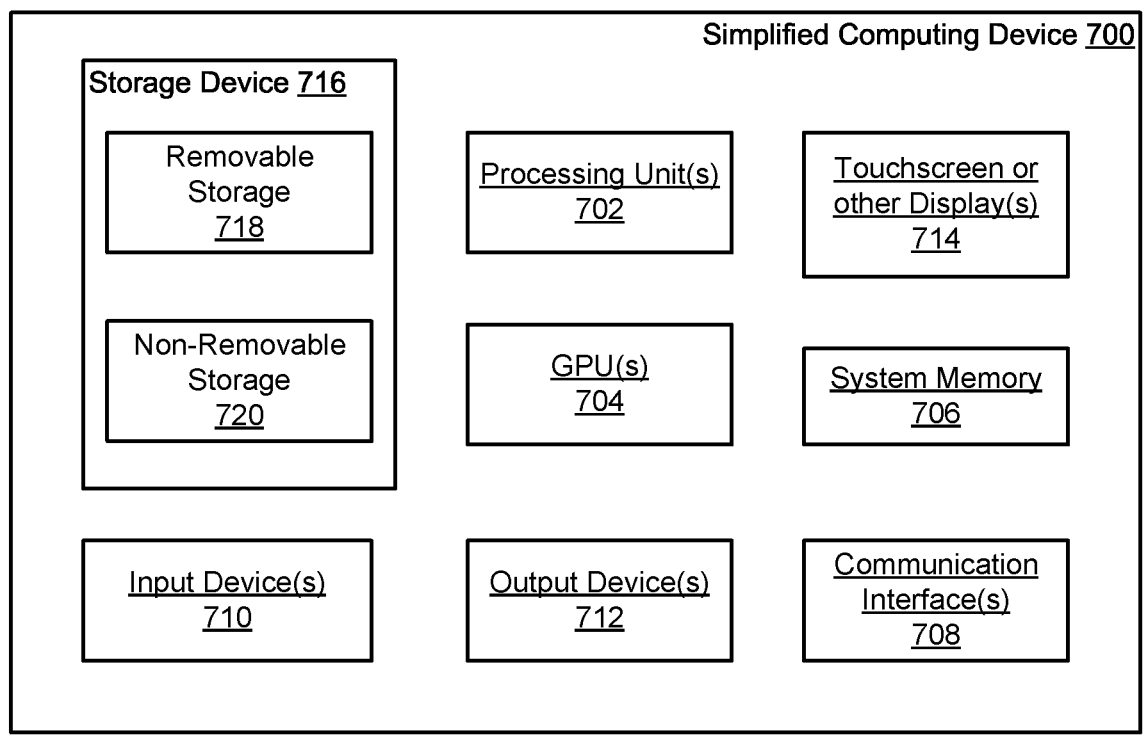
FIG. 7 is a block diagram of a computing environment in accordance with one example for implementation of the disclosed methods or one or more electronic devices.

With reference to FIG. 7, a thermal management system, as described above, may be incorporated within an exemplary computing environment 700. The computing environment 700 may correspond with one of a wide variety of computing devices, including, but not limited to, personal computers (PCs), server computers, tablet and other handheld computing devices, laptop or mobile computers, communications devices such as mobile phones, multiprocessor systems, microprocessor-based systems, set top boxes, programmable consumer electronics, network PCs, minicomputers, mainframe computers, or audio or video media players. For example, the heat dissipating apparatus is incorporated within a computing environment having an active cooling source (e.g., fans).

The computing environment 700 has sufficient computational capability and system memory to enable basic computational operations. In this example, the computing environment 700 includes one or more processing units 702, which may be individually or collectively referred to herein as a processor. The computing environment 700 may also include one or more graphics processing units (GPUs) 704. The processor 702 and/or the GPU 704 may include integrated memory and/or be in communication with system memory 706. The processor 702 and/or the GPU 704 may be a specialized microprocessor, such as a digital signal processor (DSP), a very long instruction word (VLIW) processor, or other microcontroller, or may be a general purpose central processing unit (CPU) having one or more processing cores. The processor 702, the GPU 704, the system memory 706, and/or any other components of the computing environment 700 may be packaged or otherwise integrated as a system on a chip (SoC), application-specific integrated circuit (ASIC), or other integrated circuit or system.

The computing environment 700 may also include other components, such as, for example, a communications interface 708. One or more computer input devices 710 (e.g., pointing devices, keyboards, audio input devices, video input devices, haptic input devices, or devices for receiving wired or wireless data transmissions) may be provided. The input devices 710 may include one or more touch-sensitive surfaces, such as track pads. Various output devices 712, including touchscreen or touch-sensitive display(s) 714, may also be provided. The output devices 712 may include a variety of different audio output devices, video output devices, and/or devices for transmitting wired or wireless data transmissions.

The computing environment 700 may also include a variety of computer readable media for storage of information such as computer-readable or computer-executable instructions, data structures, program modules, or other data. Computer readable media may be any available media accessible via storage devices 716 and includes both volatile and nonvolatile media, whether in removable storage 718 and/or non-removable storage 720. Computer readable media may include computer storage media and communication media. Computer storage media may include both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which may be used to store the desired information and which may be accessed by the processing units of the computing environment 700.

While the present claim scope has been described with reference to specific examples, which are intended to be illustrative only and not to be limiting of the claim scope, it will be apparent to those of ordinary skill in the art that changes, additions and/or deletions may be made to the disclosed embodiments without departing from the spirit and scope of the claims.

The foregoing description is given for clearness of understanding only, and no unnecessary limitations should be understood therefrom, as modifications within the scope of the claims may be apparent to those having ordinary skill in the art.

In a first embodiment, a computing device includes a dynamic phase change device. The dynamic phase change device includes a wick structure with a valve. The valve is operable to regulate a working fluid of the dynamic phase change device based on a position of the valve. The computing device further includes a battery physically connected to and in thermal communication with the dynamic phase change device, a sensor, and a first heat generating component physically and thermally connected to the dynamic phase change device. The sensor is operable to determine a temperature of the battery. The first heat generating component or a second heat generating component is configured to compare the determined temperature to a predetermined temperature, and control the valve based on the comparison.

In a second embodiment, with reference to the first embodiment, the first heat generating component includes a charger. The charger is physically connected to and in thermal communication with the dynamic phase change device. The charger is electrically connected to the battery.

In a third embodiment, with reference to the second embodiment, the charger is operable to control a charging current for the battery. The charger is configured to set the charging current for the battery from the charger based on the comparison.

In a fourth embodiment, with reference to the third embodiment, the predetermined temperature is a first predetermined temperature. The charger or the second heat generating component is further configured to compare the determined temperature to a second predetermined temperature. The second predetermined temperature is greater than the first predetermined temperature. The processor is further configured to control the charging current for the battery from the charger based on the comparison of the determined temperature to the second predetermined temperature.

In a fifth embodiment, with reference to the fourth embodiment, the charger or the second heat generating component being configured to control the charging current includes the charger or the second heat generating component being configured to set the charging current to a greater current when the determined temperature is greater than the first predetermined temperature and less than the second predetermined temperature, compared to when the determined temperature is less than the first predetermined temperature or is greater than the second predetermined temperature.

In a sixth embodiment, with reference to the second embodiment, the charger includes a protection circuit module.

In a seventh embodiment, with reference to the second embodiment, the power source and the charger abut a same side of the dynamic phase change device. The charger abuts or is adjacent to the power source.

In an eighth embodiment, with reference to the first embodiment, the computing device further includes a housing supporting the processor, the dynamic phase change device, the power source, the sensor, and the first heat generating component, the housing having an inner surface. The wick structure is disposed on the inner surface of the housing.

In a ninth embodiment, with reference to the first embodiment, the first heat generating component or the second heat generating component is configured to control the valve based on the comparison such that the valve is closed when the determined temperature is less than the predetermined temperature and the valve is open when the determined temperature is greater than the predetermined temperature. The valve is operable to block or divert the working fluid of the dynamic vapor chamber when the valve is closed. The working fluid is allowed to flow when the valve is open.

In a tenth embodiment, with reference to the ninth embodiment, the first heat generating component includes a processor. The dynamic phase change device includes a heat pipe, and a vapor chamber or a heat spreader. The heat pipe extends between the processor, and the vapor chamber or the heat spreader. The battery abuts the vapor chamber or the heat spreader. The heat pipe includes the valve.

In an eleventh embodiment, with reference to the first embodiment, the valve includes a magnetic switch operable to move a portion of the wick structure.

In eleventh twelfth embodiment, a method for optimizing charging of a power source of a computing device includes determining, by a sensor, a temperature of the power source. The power source abuts or is adjacent to a vapor chamber. The vapor chamber includes a valve that is controllable. The method also includes comparing, by a processor, the determined temperature to a first predetermined temperature and a second predetermined temperature. The second predetermined temperature is greater than the first predetermined temperature. The method also includes controlling the valve based on the comparing of the determined temperature to the first predetermined temperature, and controlling, by the processor, via a charger, a charging current for the power source based on the comparing of the determined temperature to the first predetermined temperature and the second predetermined temperature. The charger abuts or is adjacent to the vapor chamber.

In a thirteenth embodiment, with reference to the twelfth embodiment, the controlling of the valve includes setting, by the processor, the valve to a closed position when the determined temperature is less than the first predetermined temperature, and setting, by the processor, the valve to an open position when the determined temperature is greater than the first predetermined temperature. The valve is operable to divert or block a flow of a working fluid of the vapor chamber when in the closed position. The valve allows the working fluid to flow when in the open position.

In a fourteenth embodiment, with reference to the thirteenth embodiment, controlling the charging current includes controlling the charging current such that the charging current is greater when the determined temperature is greater than the first predetermined temperature and less than the second predetermined temperature, compared to when the determined temperature is less than the first predetermined temperature or is greater than the second predetermined temperature.

In a fifteenth embodiment, with reference to the twelfth embodiment, the method further includes comparing, by the processor, the determined temperature to a third predetermined temperature. The third predetermined temperature is greater than the second predetermined temperature. The method also includes controlling, by the processor, via the charger, the charging current for the power source based on the comparing of the determined temperature to the third predetermined temperature.

In a sixteenth embodiment, with reference to the fifteenth embodiment, controlling the charging current includes controlling the charging current such that the charging current is set to zero amperes when the determined temperature is greater than the third predetermined temperature.

In a seventeenth embodiment, a computing device includes a processor and a dynamic phase change device that is controllable by the processor. The dynamic phase change device is operable to divert or block flow of a working fluid of the dynamic phase change device when the dynamic phase change device is in a first configuration, and allow the working fluid to flow when the dynamic phase change device is in a second configuration. The computing device also includes a first heat generating component supported by the dynamic phase change device, a sensor in communication with the processor, and a second heat generating component supported by the dynamic phase change device. The sensor is operable to determine a temperature of the first heat generating component. The second heat generating component is adjacent to or abutting the first heat generating component. The processor is configured to set the dynamic phase change device to the first configuration or the second configuration based on the determined temperature.

In an eighteenth embodiment, with reference to the seventeenth embodiment, the first heat generating component includes a battery, and the second heat generating component includes a charger for the battery. The charger is electrically connected to the battery and is operable to control a current to the battery.

In a nineteenth embodiment, with reference to the eighteenth embodiment, the dynamic phase change device is a vapor chamber. The vapor chamber includes a wick structure with a valve that is controllable by the processor, such that the valve is movable between an open position and a closed position. The first configuration of the vapor chamber is the valve being in the closed position, and the second configuration of the vapor chamber being the valve being in the open position In a twentieth embodiment, with reference to the nineteenth embodiment, the processor is further configured to compare the determined temperature to a predetermined temperature, set the valve to the closed position when the determined temperature is less than the predetermined temperature, and set the valve to the open position when the determined temperature is greater than the predetermined temperature.

In connection with any one of the aforementioned embodiments, the thermal management device or the method for manufacturing the thermal management device may alternatively or additionally include any combination of one or more of the previous embodiments.

The foregoing description is given for clearness of understanding only, and no unnecessary limitations should be understood therefrom, as modifications within the scope of the claims may be apparent to those having ordinary skill in the art.

The invention claimed is:

1. A computing device comprising:
a dynamic phase change device comprising a wick structure with a valve, the valve being operable to regulate a working fluid of the dynamic phase change device based on a position of the valve, the dynamic phase change device configured to change a phase of the working fluid from a liquid to a gas;
a battery physically connected to and in thermal communication with the dynamic phase change device;
a sensor operable to determine a temperature of the battery; and
a first heat generating component physically and thermally connected to the dynamic phase change device, and
wherein the first heat generating component or a second heat generating component is configured to:
compare the determined temperature to a predetermined temperature; and
control the valve based on the comparison.

2. The computing device of claim 1, wherein the first heat generating component comprises a charger, the charger being physically connected to and in thermal communication with the dynamic phase change device, the charger being electrically connected to the battery.

3. The computing device of claim 2, wherein the charger is operable to control a charging current for the battery, and
wherein the charger is configured to set the charging current for the battery from the charger based on the comparison.

4. The computing device of claim 3, wherein the predetermined temperature is a first predetermined temperature,
wherein the charger or the second heat generating component is further configured to:

compare the determined temperature to a second predetermined temperature, the second predetermined temperature being greater than the first predetermined temperature; and control the charging current for the battery from the charger based on the comparison of the determined temperature to the second predetermined temperature.

5. The computing device of claim 4, wherein the charger or the second heat generating component being configured to control the charging current comprises the charger or the second heat generating component being configured to set the charging current to a greater current when the determined temperature is greater than the first predetermined temperature and less than the second predetermined temperature, compared to when the determined temperature is less than the first predetermined temperature or is greater than the second predetermined temperature.

6. The computing device of claim 2, wherein the charger comprises a protection circuit module.

7. The computing device of claim 2, wherein a power source and the charger abut a same side of the dynamic phase change device, the charger abutting or being adjacent to the power source.

8. The computing device of claim 1, further comprising a housing supporting a processor, the dynamic phase change device, a power source, the sensor, and the first heat generating component, the housing having an inner surface, and
wherein the wick structure is disposed on the inner surface of the housing.

9. The computing device of claim 1, wherein the first heat generating component or the second heat generating component is configured to control the valve based on the comparison such that the valve is closed when the determined temperature is less than the predetermined temperature and the valve is open when the determined temperature is greater than the predetermined temperature, the valve being operable to block or divert the working fluid of the dynamic vapor chamber when the valve is closed, the working fluid being allowed to flow when the valve is open.

10. The computing device of claim 9, wherein the first heat generating component comprises a processor,
wherein the dynamic phase change device comprises a heat pipe, and a vapor chamber or a heat spreader, the heat pipe extending between the processor, and the vapor chamber or the heat spreader,
wherein the battery abuts the vapor chamber or the heat spreader, and
wherein the heat pipe includes the valve.

11. The computing device of claim 1, wherein the valve comprises a magnetic switch operable to move a portion of the wick structure.

12. A method for optimizing charging of a power source of a computing device, the method comprising:
determining, by a sensor, a temperature of the power source, the power source abutting or being adjacent to a vapor chamber, the vapor chamber comprising a valve that is controllable, the vapor chamber configured to change a phase of the working fluid from a liquid to a gas;
comparing, by a processor, the determined temperature to a first predetermined temperature and a second predetermined temperature, the second predetermined temperature being greater than the first predetermined temperature;

controlling the valve based on the comparing of the determined temperature to the first predetermined temperature; and controlling, by the processor, via a charger, a charging current for the power source based on the comparing of the determined temperature to the first predetermined temperature and the second predetermined temperature, the charger abutting or being adjacent to the vapor chamber.

13. The method of claim 12, wherein the controlling of the valve comprises:
setting, by the processor, the valve to a closed position when the determined temperature is less than the first predetermined temperature, the valve being operable to divert or block a flow of a working fluid of the vapor chamber when in the closed position; and
setting, by the processor, the valve to an open position when the determined temperature is greater than the first predetermined temperature, the valve allowing the working fluid to flow when in the open position.

14. The method of claim 13, wherein controlling the charging current comprises controlling the charging current such that the charging current is greater when the determined temperature is greater than the first predetermined temperature and less than the second predetermined temperature, compared to when the determined temperature is less than the first predetermined temperature or is greater than the second predetermined temperature.

15. The method of claim 12, further comprising:
comparing, by the processor, the determined temperature to a third predetermined temperature, the third predetermined temperature being greater than the second predetermined temperature; and
controlling, by the processor, via the charger, the charging current for the power source based on the comparing of the determined temperature to the third predetermined temperature.

16. The method of claim 15, wherein controlling the charging current comprises controlling the charging current such that the charging current is set to zero amperes when the determined temperature is greater than the third predetermined temperature.

17. A computing device comprising:
a processor;
a dynamic phase change device that is controllable by the processor, the dynamic phase change device being operable to divert or block flow of a working fluid of the dynamic phase change device when the dynamic phase change device is in a first configuration, and allow the working fluid to flow when the dynamic phase change device is in a second configuration, the dynamic phase change device configured to change a phase of the working fluid from a liquid to a gas;
a first heat generating component supported by the dynamic phase change device;
a sensor in communication with the processor, the sensor operable to determine a temperature of the first heat generating component; and
a second heat generating component supported by the dynamic phase change device, the second heat generating component being adjacent to or abutting the first heat generating component;
wherein the processor is configured to set the dynamic phase change device to the first configuration or the second configuration based on the determined temperature.

18. The computing device of claim 17, wherein the first heat generating component comprises a battery, and the second heat generating component comprises a charger for the battery, the charger being electrically connected to the battery and being operable to control a current to the battery.

19. The computing device of claim 18, wherein the dynamic phase change device is a vapor chamber, the vapor chamber comprising a wick structure with a valve that is controllable by the processor, such that the valve is movable between an open position and a closed position, and
   wherein the first configuration of the vapor chamber is the valve being in the closed position, and the second configuration of the vapor chamber being the valve being in the open position.

20. The computing device of claim 19, wherein the processor is further configured to:
   compare the determined temperature to a predetermined temperature; and
   set the valve to the closed position when the determined temperature is less than the predetermined temperature; and
   set the valve to the open position when the determined temperature is greater than the predetermined temperature.

* * * * *